United States Patent
Drogi

(10) Patent No.: US 8,718,579 B2
(45) Date of Patent: May 6, 2014

(54) ENVELOPE TRACKING POWER AMPLIFIER SYSTEM WITH DELAY CALIBRATION

(71) Applicant: Quantance, Inc., San Mateo, CA (US)

(72) Inventor: Serge Francois Drogi, Flagstaff, AZ (US)

(73) Assignee: Quantance, Inc., San Mateo, CA (US)

( * ) Notice: Subject to any disclaimer, the term of this patent is extended or adjusted under 35 U.S.C. 154(b) by 0 days.

(21) Appl. No.: 13/779,461

(22) Filed: Feb. 27, 2013

(65) Prior Publication Data

US 2013/0231069 A1 Sep. 5, 2013

Related U.S. Application Data

(60) Provisional application No. 61/606,454, filed on Mar. 4, 2012.

(51) Int. Cl.
  *H04B 1/04* (2006.01)
  *H03F 3/24* (2006.01)

(52) U.S. Cl.
  CPC .................................. *H04B 1/0475* (2013.01)
  USPC ..................... 455/126; 455/114.3; 455/127.1; 375/296

(58) Field of Classification Search
  CPC ...................................................... H04B 1/0475
  USPC ................. 455/126, 127.1; 375/296
  See application file for complete search history.

(56) References Cited

U.S. PATENT DOCUMENTS

| | | |
|---|---|---|
| 2003/0076172 A1 | 4/2003 | Tichauer |
| 2003/0198300 A1 | 10/2003 | Matero et al. |
| 2005/0079835 A1 * | 4/2005 | Takabayashi et al. ..... 455/127.1 |
| 2006/0199553 A1 | 9/2006 | Kenington |
| 2007/0178854 A1 | 8/2007 | Sutardja |
| 2007/0183532 A1 | 8/2007 | Matero |
| 2007/0184795 A1 | 8/2007 | Drogi et al. |

FOREIGN PATENT DOCUMENTS

WO WO 2012/170831 A1 12/2012

OTHER PUBLICATIONS

Kimball, D.F. et al., "High-Efficiency Envelope-Tracking W-CDMA Base-Station Amplifier Using GaN HFETs," IEEE Transactions on Microwave Theory and Techniques, Nov. 2006, pp. 3848-3856, vol. 54, No. 11.

PCT International Search Report, PCT Application No. PCT/US13/28060, May 10, 2013, 13 pages.

(Continued)

*Primary Examiner* — Lee Nguyen
(74) *Attorney, Agent, or Firm* — Fenwick & West LLP

(57) ABSTRACT

An envelope tracking power amplifier system time-aligns a supply voltage to an input signal to a power amplifier. The power supply operates in a static mode for low amplitude input signals and operates in a dynamic mode for high amplitude input signals. In the static mode, the power supply produces a substantially constant supply voltage independent of the amplitude of the input signal. In the dynamic mode the power supply produces a dynamically varying envelope tracking supply voltage based on the amplitude of the input signal. A first delay is determined based on portions of the input and output signals captured during static operation of the power supply and a second delay is determined based on portions of the input and output signals captured during dynamic operation. A delay mismatch is estimated based on a difference between the first and second delays.

21 Claims, 8 Drawing Sheets

(56) References Cited

OTHER PUBLICATIONS

Wang, F.et al., "Design of Wide-Bandwidth Envelope-Tracking Power Amplifiers for OFDM Applications," IEEE Transactions on Microwave Theory and Techniques, Apr. 2005, pp. 1244-1255, vol. 53, No. 4.

Xu, J., "Full Transmitter Linearization Using a Wideband DPD Measurement Platform," Microwave Journal Jan. 15, 2013, pp. 96-104.

* cited by examiner

ENVELOPE TRACKING POWER AMPLIFIER SYSTEM WITH DELAY CALIBRATION

CROSS REFERENCE TO RELATED APPLICATIONS

This application claims the benefit of U.S. Provisional Application No. 61/606,454 entitled "Envelope Tracking Delay Calibration System" to Serge Francois Drogi filed on Mar. 4, 2012, the contents of which are incorporated by reference herein.

BACKGROUND

1. Field of Technology

Embodiments disclosed herein relate to an envelope tracking power amplifier system, and more specifically to calibrating delay in an envelope tracking power amplifier system.

2. Description of the Related Arts

In an envelope tracking (ET) power amplifier (PA) system, a power supply supplies a dynamically changing supply voltage to the PA. The supply voltage to the PA adjusts as the amplitude of the radio frequency (RF) signal to the PA changes such that the PA operates at or near peak efficiency for the given instantaneous output power requirements.

In a conventional ET PA system, varying delays may be present in the RF signal path and the envelope tracking power supply path, thus causing misalignment in the envelope tracking. This misalignment is undesirable because it causes distortion of the output signal.

SUMMARY

A delay calibration system time-aligns a supply voltage to a power amplifier RF signal in an envelope tracking system. An envelope tracking signal is generated based on a detected amplitude of an input signal. At a first time instance, the power supply is operated in a static mode to produce the supply voltage as a substantially constant voltage independent of the envelope tracking signal. At a second time instance, the power supply is operated in a dynamic mode to produce the supply voltage as a dynamically varying envelope tracking voltage based on the envelope tracking signal. A first delay between the input signal and the output signal is determined based on portions of the input and output signals captured when the power supply is operating in the static mode. A second delay between the input signal and the output signal is determined based on portions of the input and output signals captured when the power supply is operating in the dynamic mode. A delay block is programmed to compensate for a delay mismatch between the input signal to the power amplifier and the supply voltage, where the determined delay mismatch is based on a difference between the first delay and the second delay. A power amplifier powered by the supply voltage amplifies the input signal to generate an output signal.

In one embodiment, a power supply controller controls the power supply to operate in the dynamic mode responsive to the amplitude of the input signal exceeding an amplitude threshold, and controls the power supply to operate in the static mode responsive to the amplitude of the input signal being below the amplitude threshold.

In one embodiment, the first delay is determined by capturing a window of the input signal and a window of the output signal and performing a first cross correlation between low amplitude samples that are below a first threshold in the captured window of the input signal and low amplitude samples that are below the first threshold in the captured window of the output signal. The first threshold is set such that the low amplitude samples occur during static mode operation of the delay calibration system. The second delay is determined by performing a second cross correlation between high amplitude samples that are above a second threshold in the captured window of the input signal and high amplitude samples that are above the second threshold in the captured window of the output signal. The second threshold is set such that the high amplitude samples occur during dynamic mode operation of the delay calibration system. The difference between the first and second delays represents the delay mismatch between the input signal to the power amplifier and the supply voltage.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

An envelope tracking power amplifier system time-aligns a supply voltage from a power supply to an input signal to a power amplifier during a delay calibration. The power supply operates in a static mode for low amplitude input signals to the power amplifier and operates in a dynamic mode for high amplitude input signals to the power amplifier. In the static mode, the power supply produces a substantially constant supply voltage independent of the amplitude of the input signal. In the dynamic mode the power supply produces a dynamically varying envelope tracking supply voltage based on the amplitude of the input signal. A first delay is determined based on portions of the input and output signals captured during static operation of the power supply and a second delay is determined based on portions of the input and output signals captured during dynamic operation. A delay mismatch can then be estimated based on a difference between the first and second delays. A delay block is programmed to compensate for the estimated delay mismatch.

Figure 1:
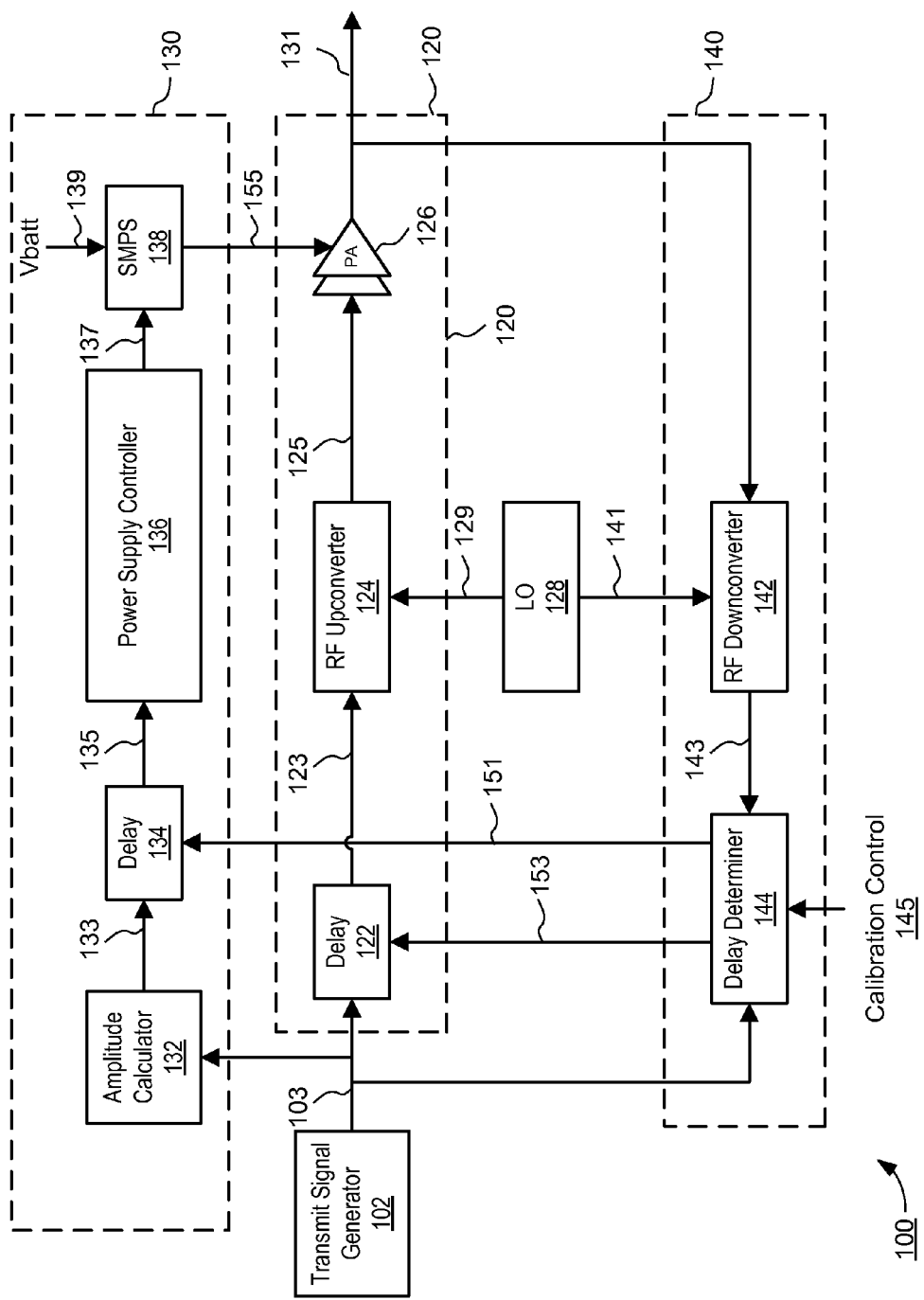
FIG. 1 is a circuit diagram illustrating a first embodiment of an envelope tracking power amplifier system with delay calibration.

FIG. 1 illustrates an embodiment of an envelope tracking power amplifier system 100. Transmit signal generator 102 generates input signal 103 for transmission by envelope tracking power amplifier system 100. Input signal may comprise, for example, a long-term evolution (LTE) signal or other signal suitable for transmission via radio frequency (RF) carrier. In a signal path 120, delay block 122 receives input signal 103 and applies a delay to input signal 103 based on delay control signal 153 to produce delayed input signal 123. RF upconverter 124 upconverts delayed input signal 123 to produce RF input signal 125 to power amplifier (PA) 126. For example, in one embodiment, RF upconverter 124 modulates delayed input signal 123 onto an RF carrier frequency based on an oscillating signal 129 produced by local oscillator (LO) 128. PA 126 amplifies RF input signal 125 to generate RF output signal 131.

In an envelope tracking path 130, amplitude calculator 132 detects an amplitude of input signal 103 and generates envelope tracking signal 133 representing the detected amplitude. Delay block 134 applies a delay to envelope tracking signal 133 based on delay control signal 151 to generate delayed envelope tracking signal 135. Power supply controller 136 receives delayed envelope tracking signal 135 and generates power supply control signal 137 to control a power supply, which is a switched-mode power supply (SMPS) 138 in this example, although other types of power supplies may be used in other embodiments. Switched-mode power supply 138 generates a supply voltage 155 to PA 126 from battery voltage (Vbatt) 139 based on power supply control signal 137. Generally, power supply controller 136 operates to control power supply 138 to increase supply voltage 155 as the amplitude of RF input signal 125 increases, and decrease supply voltage 155 as the amplitude of RF input signal 125 decreases in accordance with conventional envelope tracking principles. For example, in one embodiment, power supply controller 136 controls power supply 138 to produce an envelope tracking supply voltage 155 that enables power amplifier 126 to operate at or near optimal efficiency given the instantaneous power requirements of RF input signal 125.

Absent compensation from delay blocks 122, 134, signal path 120 and envelope tracking path 130 may have different delays through them. A difference in delays causes envelope tracking supply voltage 155 to be misaligned with RF input signal 125 to PA 126, thus degrading the efficiency of PA 126 or introducing noise into output signal 131. To ensure alignment, delay blocks 134 and/or 122 are adjusted to compensate for the delay difference as will be described below. In alternative embodiments, delay blocks 122, 134 may be positioned elsewhere within their respective signal paths 120, 130. For example, delay block 122 may alternatively be positioned between RF upconverter 124 and PA 126. Furthermore, delay block 134 may be alternatively positioned between power supply controller 136 and SMPS 138. In another embodiment, only one of delay block 122, 134 is present and the other delay block is omitted. For example, because delay through envelope tracking path 130 is generally greater than delay through signal path 120, in one embodiment, delay block 134 is omitted and delay mismatch is compensated for by adding delay to signal path 120 via delay block 122.

In feedback path 140, RF downconverter 142 receives output signal 131 and downconverts output signal 131 to generate downconverted output signal 143. For example, in one embodiment, RF downconverter 142 demodulates output signal 131 using a carrier frequency signal 141 based on local oscillator 128. Delay determiner 144 determines a relative delay between downconverted signal 143 and input signal 103. Delay determiner 144 controls delay blocks 122, 134 based on the determined delay in order to minimize or reduce misalignment.

In one embodiment, one or more RF filters (not shown) may be included between PA 126 and RF downconverter 142. These filters may introduce further delay in feedback path 140. However, because these delays are substantially invariant during the short time between delay determinations, the delay introduced by these filters can be neglected, in one embodiment.

In one embodiment, delay determiner 144 determines delay based in part on a calibration control signal 145 that provides information relating to temperature or other environmental factors, estimated mismatch at an output of PA 126 (e.g., antenna mismatch), or output power of envelope tracking power amplifier system 100 that serves as an initial offset to determining the delay. Operation of delay determiner 144 is described in further detail below.

Figure 2:
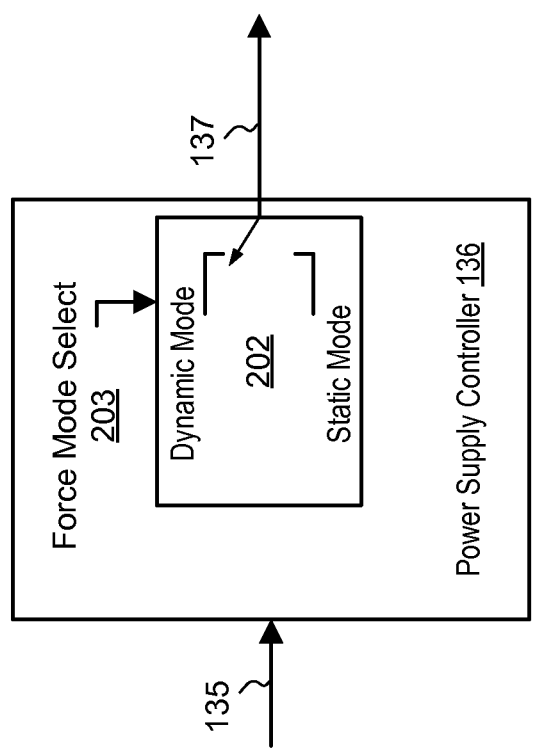
FIG. 2 is a circuit diagram illustrating an embodiment of a dual mode power supply controller.

FIG. 2 illustrates an embodiment of a power supply controller 136 having dual mode operation controlled by a mode controller 202. In dynamic mode, power supply controller 136 controls SMPS 138 to be an envelope tracking power supply that adjusts supply voltage 155 to PA 126 based on an amplitude of input signal 103 in the manner described above. In static mode, power supply controller 136 controls power supply 138 to output a substantially constant supply voltage 155 that does not perform envelope tracking.

In one embodiment, mode controller 202 automatically switches between dynamic mode and static mode based on the detected amplitude of input signal 103. For example, when the detected amplitude of input signal 103 is above a threshold amplitude, power supply controller 136 controls SMPS 138 to operate in dynamic mode as described above. When the detected amplitude of input signal 103 is below the threshold amplitude, power supply controller 136 controls SMPS 138 to operate in a static mode outputting a constant supply voltage 155. In one embodiment, a force mode select signal 203 can optionally forces mode controller 202 to either dynamic mode or static mode independently of the detected amplitude of input signal 103. In alternative embodiments, mode controller 202 may be omitted and power supply controller 136 always operates in dynamic mode.

In another alternative embodiment, power supply controller 136 includes a lookup table that maps envelope tracking signal 135 (representing a detected amplitude of input signal 103) to an envelope tracking supply voltage 155 to be applied to PA 126. Here, the lookup table may be populated such that detected amplitudes of input signal 103 below a threshold map to a constant supply voltage, while detected amplitudes of input signal 103 above the threshold map to an envelope tracking voltage level. This embodiment effectively implements the same static and dynamic control modes described above without necessarily having a switch-based mode controller 202 that switches between discrete static mode and dynamic mode. In the description below, "static mode" refers generally to an operating state in which SMPS 138 produces a substantially constant output voltage (which may be implemented via a mode controller 202, a lookup table, or other means). Similarly, dynamic mode refers generally to an operating state in which SMPS 138 produces an envelope tracking output voltage (which may be implemented via a mode controller 202, a lookup table, or other means).

Figure 3:
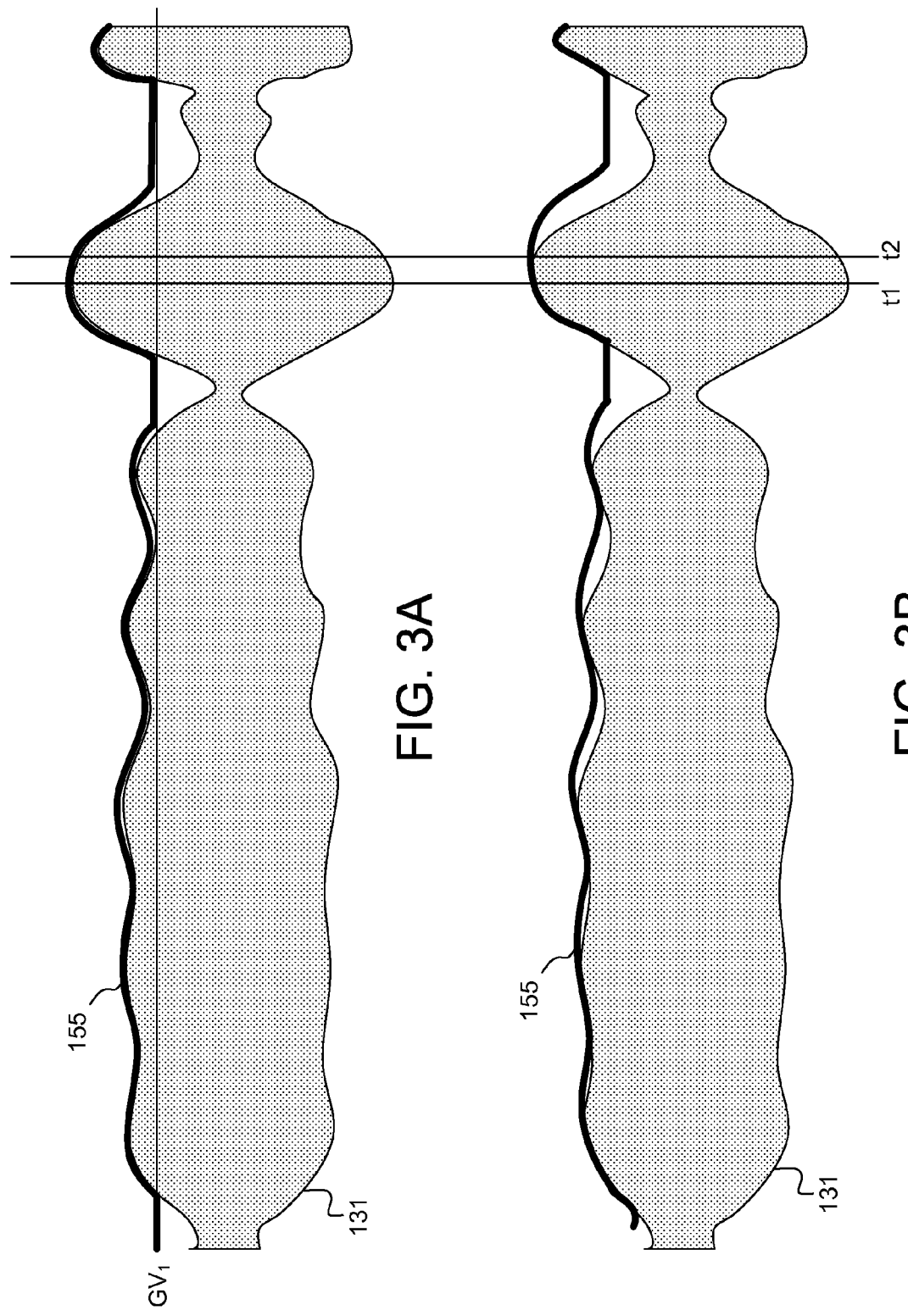
FIG. 3A is a waveform diagram illustrating an example envelope tracking supply voltage and an example power amplifier output signal that are substantially aligned.
FIG. 3B is a waveform diagram illustrating an example envelope tracking supply voltage and an example power amplifier output signal that are misaligned.

FIG. 3A-3B illustrate example waveforms produced by envelope tracking system 100. In FIG. 3A, output signal 131 represents an example RF signal such as an LTE signal. Supply voltage 155 is an envelope tracking signal that approximately follows the amplitude of an RF input signal 125 to PA 126 when RF input signal 125 is above a threshold $V_1$, and is approximately constant when RF input signal 125 is below the threshold $V_1$. For clarity of description, the threshold $V_1$ is shown as a scaled threshold $GV_1$ relative to the output signal 131, where G represents a gain of PA 126. In FIG. 3A, envelope tracking supply voltage 155 is well aligned to output signal 131.

FIG. 3B represents similar signals but envelope tracking supply voltage 155 is misaligned (e.g., delayed) relative to RF input signal 125 to PA 126. As a result, portions of the output signal 131 are clipped, causing distortion in output signal 131. For example, in the aligned example of FIG. 3A, a peak in the output signal 131 is observed at a time $t_1$. However, due to misalignment, this peak is clipped in the example of FIG. 3B, and a peak in output signal 131 instead occurs a time $t_2$. As can be observed, the difference in timing of the peaks can be used to approximate the amount of misalignment. For example, envelope tracking path 130 is observed to have an additional delay of approximately $t_2-t_1$ relative to the delay through signal path 120.

Figure 4:
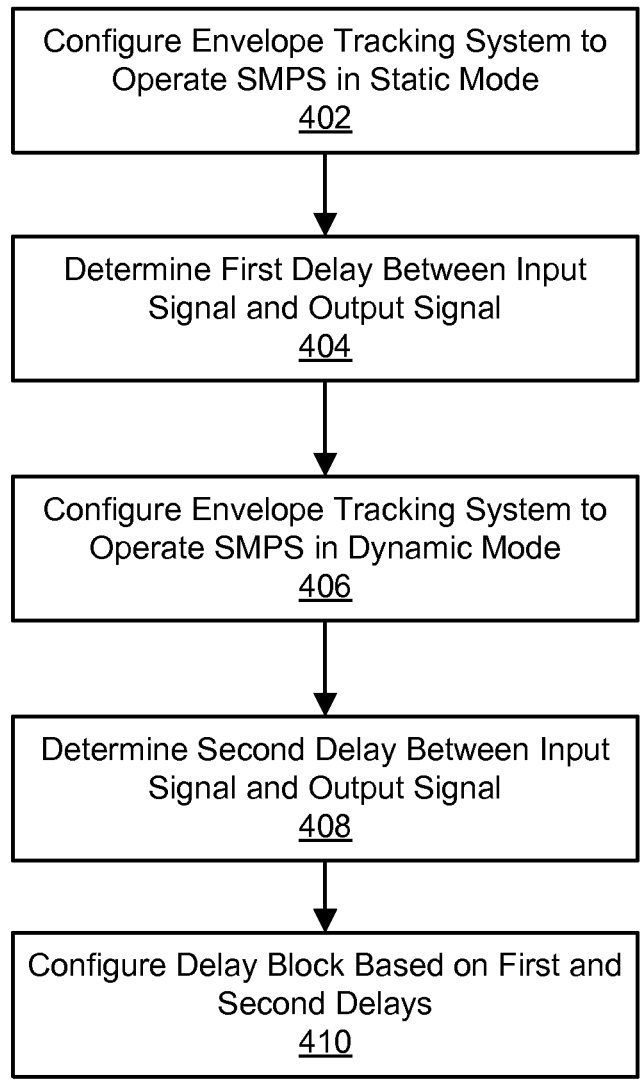
FIG. 4 is a flowchart illustrating a first embodiment of a process for calibrating delay of an envelope tracking power amplifier system.

Based on the principles described above, FIG. 4 is a flowchart illustrating an example embodiment of a process for delay calibration of envelope tracking power amplifier system 100.

Power supply controller 136 is first configured 402 to operate SMPS 138 in static mode to produce a constant supply voltage 155. Here, supply voltage 155 is set sufficiently high to satisfy the peak instantaneous power requirement of RF input signal 125 to PA 126. Delay determiner 144 then determines 404 a first delay between input signal 103 and downconverted output signal 143. The delay determination may be computed using a variety of different methods, which will be described in further detail below. The first delay is not affected by delay through envelope tracking path 130 since supply voltage 155 is static.

Power supply controller 136 is then configured 406 to operate SMPS 138 in dynamic mode so that supply voltage 155 is an envelope tracking signal. Delay determiner 144 then determines 408 a second delay between input signal 103 and downconverted output signal 143. Delay estimator 144 then configures 410 at least one of delay block 122, 134 based on the first and second delay. For example, the difference between the first and second delay approximates the difference in the relative delays through signal path 120 and envelope tracking path 130 respectively. If the first delay is less than the second delay, this means that envelope tracking path 130 has a longer delay than signal path 120, and the delay can be compensated for by increasing the delay through signal path 120 via delay block 122 and/or decreasing the delay through envelope tracking path 130 via delay block 134. Alternatively, if the first delay is more than the second delay, this means that envelope tracking path 130 has a shorter delay than signal path 120, and the delay can be compensated for by decreasing the delay through signal path 120 via delay block 122 and/or increasing the delay through envelope tracking path 130 via delay block 134.

The delay calculation in steps 404 and 408 can be performed by a variety of different methods. In one embodiment, a cross correlation is computed between a captured window (e.g., a time-limited set of samples) of input signal 103 and a captured window of downconverted output signal 143. The cross correlation yields a vector that represents similarity between the signals 103, 143 as a function of a time delay applied to one of the signals 103, 143. The cross correlation vector has a peak at a value corresponding to the time delay that, if applied to one of the signals, represents the statistical best match between the signals. The cross correlation peak therefore provides an estimate of the relative delay between the signals.

In another embodiment, delay determiner 144 detects locations of peaks of the input signal 103 and downconverted output signal 143 and computes the time delay between these peaks. Alternatively, in embodiments where power supply controller 136 does not automatically switch to static mode at low voltages, delay determiner 144 may instead detect the locations of local minima of the input signal 103 and downconverted output signal 143, and compute the delay based on the time delay between these locations. In yet another embodiment, delay determiner 144 uses a phase-based approach to delay estimation, where delay determiner 144 determines a delay based on an offset between one or more zero crossings of the input signal and output signal.

Figure 5:
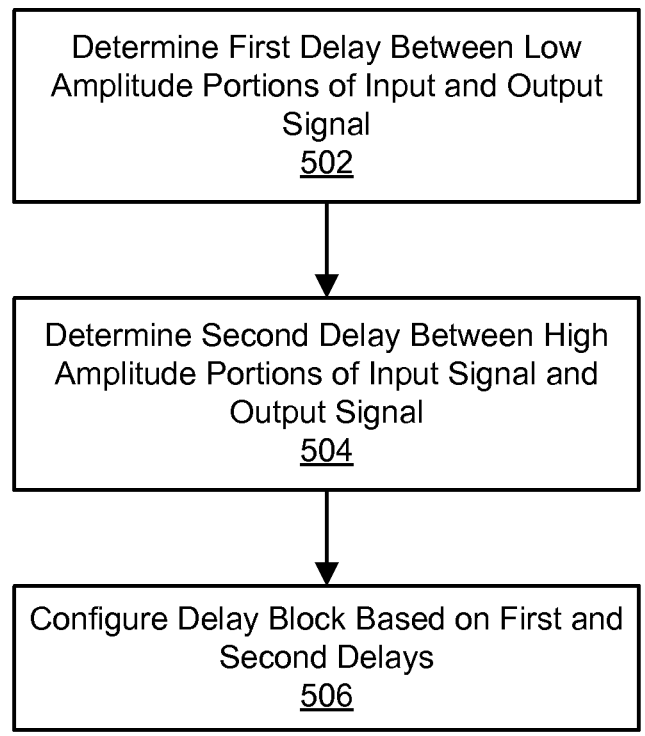
FIG. 5 is a flowchart illustrating a second embodiment of a process for calibrating delay of an envelope tracking power amplifier system.

FIG. 5 is a flowchart illustrating another embodiment of a process for delay calibration of envelope tracking system 100. This embodiment may be utilized when power supply controller 136 operates SMPS 138 in dynamic mode when the detected amplitude of input signal 103 is above a threshold and operates SMPS in static mode when the detected amplitude is below the threshold, as described above. A first delay is determined 502 between a low amplitude portion of input signal 103 and a low amplitude portion of downconverted output signal 143. Here, the low amplitude portion refers to samples of signals 103, 143 that have an amplitude below a first threshold y, where y is set such that SMPS 138 operates in static mode for amplitudes below y. Therefore, the delay through envelope tracking path 130 will not affect the first delay and the first delay will represent delay through signal path 120 only. A second delay is then determined 504 between a high amplitude portion of input signal 103 and a high amplitude portion of downconverted output signal 143. Here, the high amplitude portion refers to samples of signals 103, 143 that have an amplitude above a second threshold x, where x is set such that SMPS 138 operates in dynamic mode for amplitudes above x. The second delay is affected by the delay through envelope tracking path 130 because envelope tracking is used for high amplitude signals. Thus, the difference between the first delay and the second delay represents the relative delays through signal path 120 and envelope tracking path 130 respectively. The determined delay can be compensated for by configuring 506 at least one of the delay blocks 122, 134 based on the first and second delays.

Figure 6:
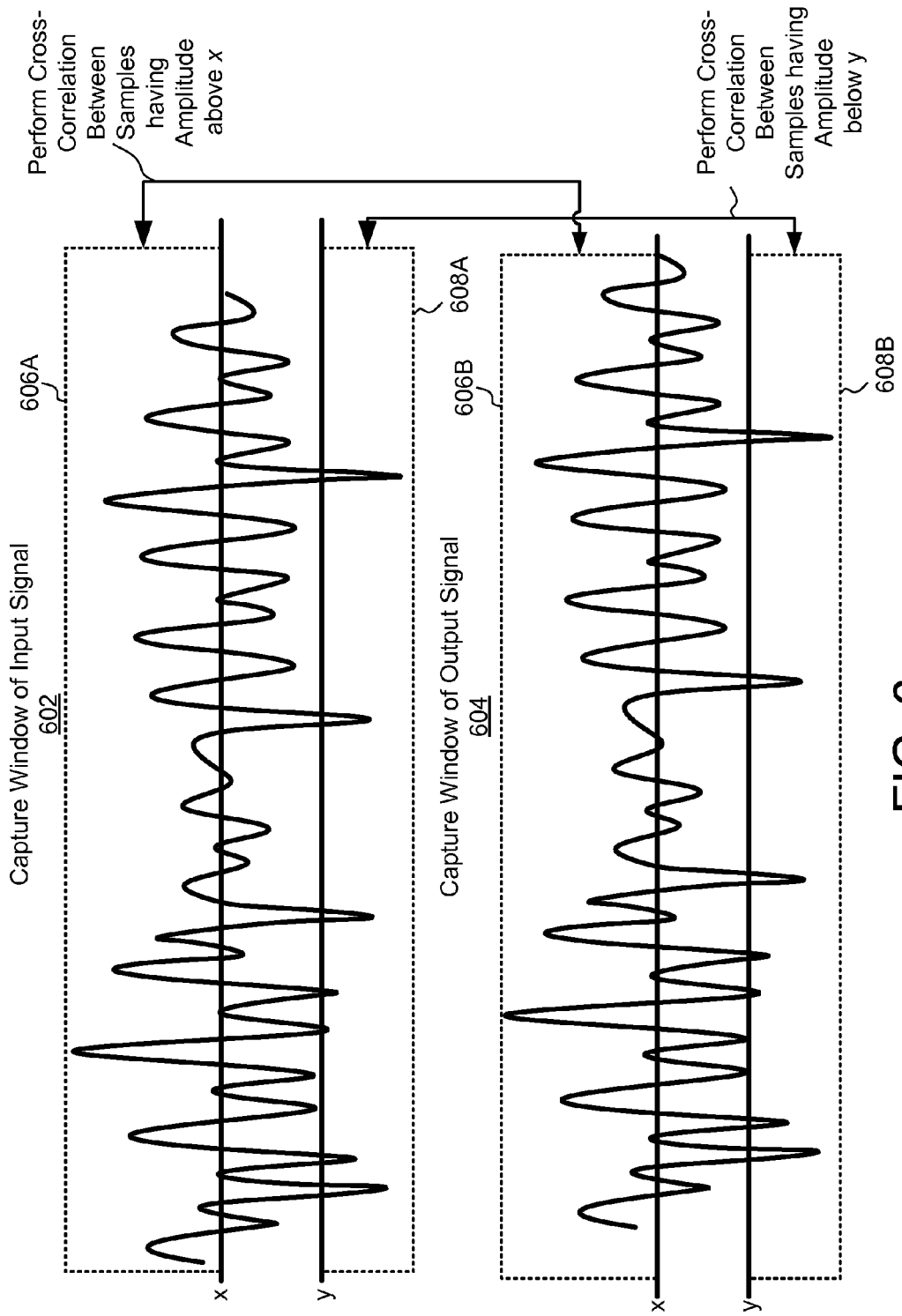
FIG. 6 is a waveform diagram illustrating a delay calibration calculation using separate cross-correlations between high amplitude portions of the input and output signals and between low amplitude portions of the input and output signals.

FIG. 6 is an example waveform diagram illustrating the calibration method of FIG. 5. Particularly, FIG. 6 illustrates an example capture window 602 of input signal 103 and an example capture window 605 of downconverted output signal 143 that are captured concurrently by delay determiner 144. As described above, a first delay is determined between the samples 606A, 606B having amplitudes above x in the captured windows of input signal 103 and downconverted output signal 143 respectively (e.g., by finding a peak of a cross-correlation between the samples having amplitudes above x). A second delay is determined between the samples 608A, 608B having amplitudes below y in the captured windows of input signal 103 and downconverted output signal 143 respectively (e.g., by finding a peak of a cross-correlation between the samples having amplitudes below y).

In one embodiment, the second threshold x is set at the average amplitude of the input signal 103 (or downconverted output signal 143) in the captured window 602 (or 604), although other values of x are also possible. Furthermore, in one embodiment, the first threshold y is set to be x/2, although other values of y are also possible. In one embodiment, where a lookup table is used by power converter controller 136 to determine voltage levels of supply voltage 155, delay determiner 144 may use the values from the lookup table to set x and y. For example, delay determiner 144 can determine the amplitude threshold where power convert controller 136 will switch between static and dynamic operation, and set x and y to ensure that amplitudes above x occur during dynamic operation and amplitudes below y occur during static operation.

An advantage of the calibration technique described in FIGS. 5-6 is that envelope tracking system 100 does not need to enter a separate calibration mode to perform the delay calibration. Rather, envelope tracking system 100 can detect the delay and adjust delay block 122, 134 based on real-time observation of input and output signals during normal operation of envelope tracking system 100. Another advantage of the embodiments of FIGS. 5-6 is that calibration can be performed based on a single capture window for each of the input signal 103 and downconverted output signal 143, rather than performing separate captures at two separate times. This eliminates the effect of jitter from sampling of input signal 103 or the effects of variable environmental parameters that could change over time.

Figure 7:
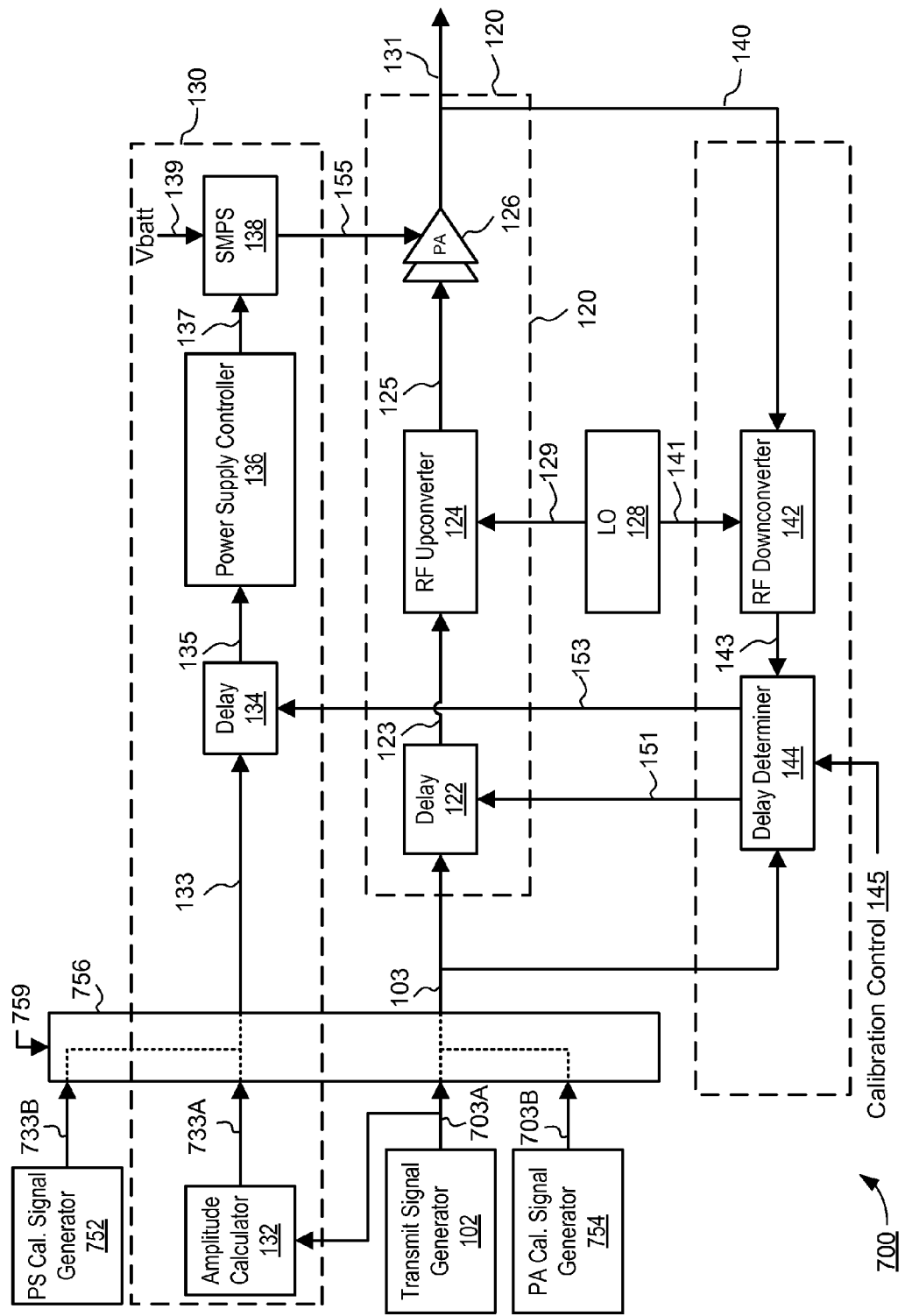
FIG. 7 is a circuit diagram illustrating a second embodiment of an envelope tracking power amplifier system with delay calibration.

FIG. 7 illustrates an alternative embodiment of an envelope tracking power amplifier system 700. Envelope tracking power amplifier system 700 is similar to envelope tracking power amplifier system 100 described above, but includes a power supply calibration signal generator 752, a power amplifier calibration signal generator 754, and a calibration switch 756. Depending on a mode select signal 759, calibration switch 756 selects between a power supply calibration signal 733B generated by power supply calibration signal generator 752 and envelope tracking signal 733A tracking the amplitude of input signal 103 generated by amplitude calculator 132 to be applied as input signal 133 to envelope tracking path 130. Similarly, depending on mode select signal 759, calibration switch 756 selects between a power amplifier calibration signal 703B generated by power amplifier calibration signal generator 754 and transmit signal 703A generated by transmit signal generator 102 to be applied as input signal 103 to signal path 120.

Enabling envelope tracking power amplifier system 100 to use dedicated calibration signals 703B, 733B during calibration in place of regular transmit signals 703A, 733A (e.g., an LTE signal) may enable envelope tracking power amplifier system 100 to perform the delay estimation more precisely. Various signals can be used as power supply calibration signal 733B and power amplifier calibration signal 703B in a calibration mode. For example, in one embodiment, power amplifier calibration signal 703B comprises a continuous wave signal of substantially constant amplitude and frequency. In another embodiment, power amplifier calibration signal 703B comprises a square wave signal. Similarly, in various embodiments, power supply calibration signal 733B may comprise, for example, a square wave or a constant voltage signal.

In various embodiments, calibration may be performed using different combinations of power supply calibration signal 733B, envelope tracking signal 733A, transmit signal 703A, and power amplifier calibration signal 703B. For example, in one embodiment, calibration is performed using power amplifier calibration signal 703B in signal path 120 and envelope tracking signal 733A (based on transmit signal 703A) in envelope tracking path 130. In another embodiment, calibration is performed using power supply calibration signal 733B through envelope tracking path 130 and transmit signal 703A through signal path 120. In yet another embodiment, power amplifier calibration signal 703B and power supply calibration signal 733B are both applied during calibration. Calibration using these dedication calibration signals can be performed using, for example, an amplitude correlation technique as described above. For example, windows of downconverted output signal 143 and input signal 103 are captured and a cross-correlation is performed between the captured windows. The delay corresponding to the peak of the cross-correlation represents the delay mismatch between signal path 120 and envelope tracking path 130, and can be used to configure delay blocks 122 and/or 134. In another alternative embodiments, a different method can be used to determine the delay, such as, for example using a phase-based correlation based on comparing the relative delay between zero-crossings of input signal 103 and downconverted output signal 143.

In one embodiment, a calibration mode may be performed prior to normal operation in which delay values are measured at a plurality of different times using any of the methods discussed above, where it expected that various measurable conditions that affect delay will vary between measurements. For example, these conditions may include environmental conditions (e.g., temperature), estimated mismatch at an output of PA 126 (e.g., antenna mismatch), output power, or other potentially time-varying conditions. Thus, a delay can be predicted for a given set of measured conditions and stored to a lookup table used by the delay determiner 144. In one embodiment, the predicted delay can be used during real-time operation instead of performing a real-time delay measurement. For example, in one embodiment, delay determiner 144 monitors various conditions of envelope tracking power amplifier system 100 (or envelope tracking power amplifier system 700), performs a lookup in the lookup table based on the measured conditions, and calibrates delay of delay blocks 122, 134 based on the pre-calibrated values in the lookup table.

In another embodiment, the predetermined delays in the lookup table are used in a predictive way to complement a real-time delay calibration during normal operation. For example, in one embodiment, prior to a delay measurement, delay determiner 144 performs a lookup in the lookup table to determine an expected delay based on measured conditions. Delay determiner 144 may use the expected delay to determine when to start the capture window of the downconverted output signal 143 relative to the capture window of input signal 103 using any of the delay calibration techniques described above. By having a good estimate of the expected delay prior to capture, delay determiner 144 can shorten the size of the capture windows, thus improving computational efficiency.

Figure 8:
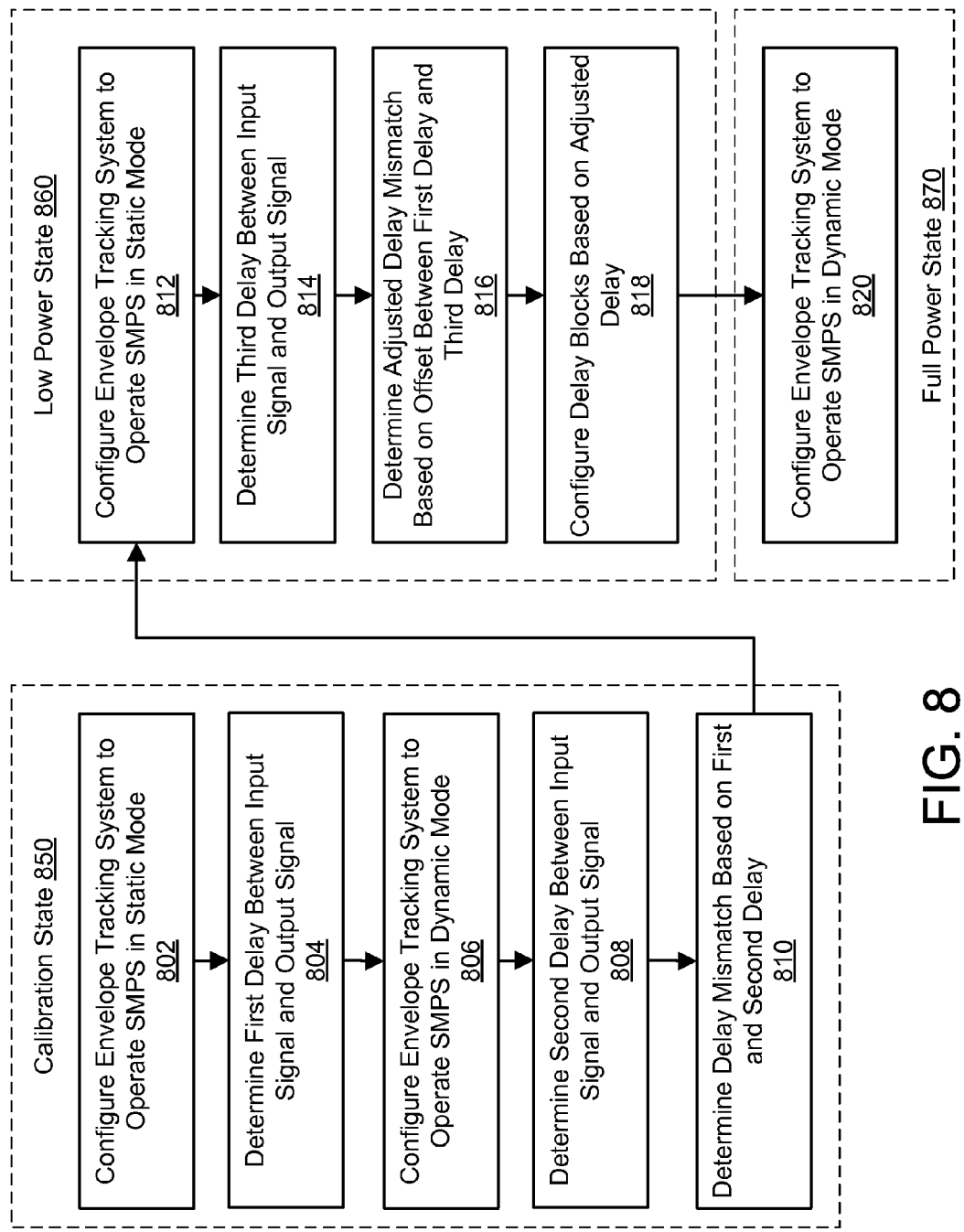
FIG. 8 is a flowchart illustrating a third embodiment of a process for calibrating delay of an envelope tracking power amplifier system.

FIG. 8 illustrates another alternative embodiment of a delay calibration process for an envelope tracking power amplifier system 100 that operates in one of three states: (1) a calibration state 850; (2) a low-power operation state 860; and (3) a full-power operation state 870. These states may be used, for example, in an envelope tracking power amplifier system 100 that is a component of a cellular device or other wireless communications device. Generally, in the calibration state 850, envelope tracking power amplifier system 100 determines an initial delay estimate using techniques similar to those described above. The low power operation state 860 is typically entered during startup conditions of the device, for example, when a cellular device is attempting to locate a network to connect to. SMPS 138 typically operates in static mode in the low power state 860 because low amplitude signals are present. The full power operation state 870 is typically used during normal operation of the device. SMPS 138 typically operates in dynamic (envelope tracking) mode for at least a portion of the time in the full power state 870 because high amplitude signals are present. For example, SMPS 138 may switch between static mode (for low amplitude signals) and dynamic mode (for high amplitude signals) when operating in the full power state 870. The illustrated process enables envelope tracking power amplifier system 100 to calibrate the delay when operating in the lower power state 860 where SMPS 138 is not performing envelope tracking prior to transitioning to the full-power state 870 where envelope tracking is used.

Specifically, in the calibration state 850, envelope tracking system 100 is configured 802 to operate SMPS 138 in static mode and a first delay is determined 804 between input signal 103 and downconverted output signal 143. Envelope tracking system 100 is then configured 806 to operate SMPS 138 in dynamic mode and a second delay is determined 808 between input signal 103 and downconverted output signal 143. A delay mismatch is then determined 810 based on the first and second delay using any of the techniques described above.

In the low power state 860 (e.g., during start up conditions), envelope tracking system 100 is configured 812 to operate in static mode because only low amplitude signals are present in this state. A third delay is determined 814 between input signal 103 and downconverted output signal 143. An adjusted delay mismatch is then determined 816 based on an offset between the first delay and the third delay. The amount of adjustment represents a difference between the calibrated delay mismatch determined during the calibration state 850 and the actual delay mismatch measured in the low power state 860. Delay block 122, 134 can then be configured 818 based on the adjusted delay mismatch prior to entering the full power envelope tracking state 870.

Envelope tracking system 100 then transitions to the full power (envelope tracking) state 870 by configuring 820 SMPS 138 to operate in dynamic mode. Here, the delay has already been pre-configured and will therefore be substantially aligned when transitioning to the full-power state 870. In some embodiments, additional calibrations may be performed in the high power state 870 using the techniques described above to further refine the delay calibration or adapt to changing environmental conditions that may affect delay. In additional alternative embodiments, the process of FIG. 8 can be applied to envelope tracking power amplifier 700 described above using one or more dedicated calibration signals in place of the normal transmit and envelope tracking signals.

Upon reading this disclosure, those of skill in the art will appreciate still additional alternative designs for an envelope tracking system with delay calibration. Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the spirit and scope of the disclosure.

What is claimed is:

1. A method for time-aligning a supply voltage to a power amplifier in an envelope tracking power amplifier system, the method comprising:
generating an envelope tracking signal tracking a detected amplitude of an input signal to the power amplifier;
at a first time instance, operating the power supply in a static mode to produce the supply voltage as a substantially constant voltage independent of the envelope tracking signal;
at a second time instance, operating the power supply in a dynamic mode to produce the supply voltage as a dynamically varying envelope tracking voltage based on the envelope tracking signal;
determining a first delay between the input signal and an output signal of the power amplifier based on portions of the input signal and the output signal captured when the power supply is operating in the static mode;
determining a second delay between the input signal and the output signal based on portions of the input signal and the output signal captured when the power supply is operating in the dynamic mode;
configuring a delay block to compensate for a determined delay mismatch between the input signal to the power amplifier and the supply voltage, the determined delay mismatch based on a difference between the first delay and the second delay; and
amplifying, by a power amplifier, the input signal to generate an output signal, the power amplifier powered from the supply voltage.

2. The method claim 1, wherein configuring the delay block comprises:
configuring the delay block to add a delay to the envelope tracking signal, the delay corresponding to the difference between the first delay and the second delay.

3. The method of claim 1, wherein configuring the delay block comprises:
configuring the delay block to add a delay to the input signal to the power amplifier, the delay corresponding to the difference between the first delay and the second delay.

4. The method of claim 1, further comprising:
controlling the power supply to operate in the dynamic mode responsive to the amplitude of the input signal exceeding an amplitude threshold; and
controlling the power supply to operate in the static mode responsive to the amplitude of the input signal being below the amplitude threshold.

5. The method of claim 4, further comprising:
capturing a window of the input signal and a window of the output signal;
wherein determining the first delay comprises performing a first cross correlation between low amplitude samples that are below a first threshold in the captured window of the input signal and low amplitude samples that are below the first threshold in the captured window of the output signal; and
wherein determining the second delay comprises performing a second cross correlation between high amplitude samples that are above a second threshold in the captured window of the input signal and high amplitude samples that are above the second threshold in the captured window of the output signal, the second threshold being greater than the first threshold.

6. The method of claim 5, further comprising:
setting the first threshold such that the low amplitude samples are below the amplitude threshold and the power supply operates in the static mode; and
setting the second threshold such that the high amplitude samples are above the amplitude threshold and the power supply operates in the dynamic mode.

7. The method of claim 5,
wherein determining the first delay further comprises determining a first delay value corresponding to a peak of the first cross correlation; and
wherein determining the second delay further comprises determining a second delay value corresponding to the a peak of the second cross correlation.

8. The method of claim 5, wherein capturing the window of the input signal and the window of the output signal comprises:
performing a lookup in a lookup table to determine an expected delay of the output signal relative to the input signal as a function of at least one of: temperature, an estimate of mismatch at an output of the power amplifier, and output power of the envelope tracking power amplifier system; and
determining a start time of the captured window of the output signal relative to a start time of the captured window of the input signal based on the expected delay.

9. The method of claim 1, further comprising:
generating a power supply calibration signal;
providing the power supply calibration signal to the power supply in place of the envelope tracking signal during a calibration mode.

10. The method of claim 1, further comprising:
generating a power amplifier calibration signal;
providing the power amplifier calibration signal to the power amplifier in place of the input signal during a calibration mode.

11. A power amplifier system comprising:
a power amplifier amplifying an input signal to generate an output signal, the power amplify powered from a supply voltage;
a power supply generating the supply voltage, the power supply operating in one of a static mode and a dynamic mode, the power supply producing the supply voltage as a substantially constant voltage independent of an amplitude of the input signal when operating in a static mode and the power supply producing the supply voltage as a dynamically varying envelope tracking voltage tracking an amplitude of the input signal when operating in the dynamic mode;
a delay determiner to determine a first delay between the input signal and the output signal based on portions of the input signal and the output signal captured when the power supply is operating in the static mode and to determine a second delay between the input signal and the output signal based on portions of the input signal and the output signal captured when the power supply is operating in the dynamic mode; and
a delay block programmable by the delay determiner, the delay block to compensate for a determined delay mismatch between the input signal to the power amplifier and the supply voltage, the determined delay based on a difference between the first delay and the second delay.

12. The power amplifier system of claim 11, wherein the delay block is coupled in series with the power amplifier between the input signal and the output signal, and wherein the delay block is configured to add a delay corresponding to the difference between the first delay and the second delay.

13. The power amplifier system of claim 11, wherein the delay block is coupled in series with the power supply, and wherein the delay block is configured to add a delay corresponding to the difference between the first delay and the second delay.

14. The power amplifier system of claim 11, wherein the power supply operates in the dynamic mode responsive to the amplitude of the input signal exceeding an amplitude threshold, and wherein the power supply operates in the static mode responsive to the amplitude of the input signal being below the amplitude threshold.

15. The power amplifier system of claim 14, where the delay determiner captures a window of the input signal and a window of the output signal and determines the first delay based on a first comparison of low amplitude samples that are below a first threshold in the captured window of the input signal and the captured window of the output signal, and determines the second delay based on a comparison of high amplitude samples that exceed a second threshold in the captured window of the input signal and the captured window of the output signal, the second threshold being greater than the first threshold.

16. The power amplifier system of claim 15, wherein the first threshold is set such that the low amplitude samples are below the amplitude threshold and the power supply operates in the static mode, and wherein the second threshold is set such that the high amplitude samples are above the amplitude threshold and the power supply operates in the dynamic mode, the second threshold being greater than the first threshold.

17. The power amplifier system of claim 15, wherein the first delay is determined based on a peak of a cross correlation between the low amplitude samples in the capture window of the input signal and the low amplitude samples in the captured window of the output signal, and wherein the second delay is determined based on a peak of a cross correlation between the high amplitude samples in the capture window of the input signal and the high amplitude samples in the captured window of the output signal.

18. The power amplifier system of claim 15, wherein the delay determiner comprises:
a lookup table for determining an expected delay of the output signal relative to the input signal as a function of at least one of: temperature, an estimate of mismatch at an output of the power amplifier, and output power of the power amplifier system,
wherein the delay determiner determines a start time of the captured window of the output signal relative to a start time of the captured window of the input signal based on the expected delay.

19. The power amplifier system of claim 11, further comprising:
- a power supply calibration signal generator generating a power supply calibration signal; and
- an amplitude detector for generating an envelope tracking signal based on the input signal; and
- a calibration switch for providing the power supply calibration signal to the power supply during a calibration mode of the power amplifier system and providing the envelope tracking signal to the power supply during a normal mode of the power amplifier system.

20. The power amplifier system of claim 11, further comprising:
- a power amplifier calibration signal generator generating a power amplifier calibration signal; and
- a transmit signal generator generating a transmit signal; and
- a calibration switch for providing the power amplifier calibration signal to the power amplifier during a calibration mode of the power amplifier system and providing the transmit signal to the power amplifier during a normal mode of the power amplifier system.

21. A method for time-aligning a supply voltage to a power amplifier in an envelope tracking power amplifier system, the method comprising:
- generating an envelope tracking signal tracking a detected amplitude of an input signal to the power amplifier;
- at a first time instance, operating the power supply in a static mode to produce the supply voltage as a substantially constant voltage independent of the envelope tracking signal;
- at a second time instance, operating the power supply in a dynamic mode to produce the supply voltage as a dynamically varying envelope tracking voltage based on the envelope tracking signal;
- determining a first delay between the input signal and an output signal of the power amplifier based on portions of the input signal and the output signal captured when the power supply is operating in the static mode;
- determining a second delay between the input signal and the output signal based on portions of the input signal and the output signal captured when the power supply is operating in the dynamic mode;
- storing values for the first and second delay as calibration values;
- determining an initial delay mismatch between the input signal to the power amplifier and the supply voltage, the determined delay mismatch based on a difference between the first delay and the second delay;
- after configuring the delay block based on the calibration values, operating the power supply in the static mode;
- determining a third delay between the input signal and the output signal based on portions of the input signal and the output signal captured when the power supply is operating in the static mode;
- determining an adjusted delay mismatch based on a difference between the third delay and the first delay;
- configuring a delay block to compensate for the determined adjusted delay mismatch; and
- amplifying, by a power amplifier, the input signal to generate an output signal, the power amplifier powered from the supply voltage.

* * * * *